United States Patent
Yi Chang et al.

(10) Patent No.: US 8,796,117 B2
(45) Date of Patent: Aug. 5, 2014

(54) STRUCTURE OF HIGH ELECTRON MOBILITY TRANSISTOR GROWTH ON SI SUBSTRATE AND THE METHOD THEREOF

(75) Inventors: Edward Yi Chang, Hsinchu County (TW); Shih-Hsuan Tang, New Taipei (TW); Yueh-Chin Lin, New Taipei (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/561,977

(22) Filed: Jul. 30, 2012

(65) Prior Publication Data
US 2013/0049070 A1    Feb. 28, 2013

(30) Foreign Application Priority Data
Aug. 26, 2011    (TW) .............................. 100130732 A

(51) Int. Cl.
*H01L 21/20*    (2006.01)
*H01L 21/36*    (2006.01)

(52) U.S. Cl.
USPC .................................. 438/478; 257/E29.246

(58) Field of Classification Search
USPC ....................................................... 438/478
See application file for complete search history.

(56) References Cited

U.S. PATENT DOCUMENTS

| 6,403,976 B1* | 6/2002 | Saitoh et al. ..................... 257/19 |
| 7,829,448 B1* | 11/2010 | Chang et al. ................... 438/576 |
| 2003/0013319 A1* | 1/2003 | Holmes et al. ................ 438/761 |
| 2005/0199883 A1* | 9/2005 | Borghs et al. .................... 257/78 |
| 2006/0197129 A1* | 9/2006 | Wohlmuth ..................... 257/296 |
| 2010/0327316 A1* | 12/2010 | Pourtois et al. ............... 257/190 |

* cited by examiner

*Primary Examiner* — Matthew Landau
*Assistant Examiner* — Igwe U Anya
(74) *Attorney, Agent, or Firm* — Birch, Stewart, Kolasch & Birch, LLP

(57) ABSTRACT

A structure of high electron mobility transistor growth on Si substrate and the method thereof, in particular used for the semiconductor device manufacturing in the semiconductor industry. The UHVCVD system was used in the related invention to grow a Ge film on Si substrate then grow the high electron mobility transistor on the Ge film for the reduction of buffer layer thickness and cost. The function of the Ge film is preventing the formation of silicon oxide when growing III-V MHEMT structure in MOCVD system on Si substrate. The reason of using MHEMT in the invention is that the metamorphic buffer layer in MHEMT structure could block the penetration of dislocation which is formed because of the very large lattice mismatch (4.2%) between Ge and Si substrate.

2 Claims, 2 Drawing Sheets

STRUCTURE OF HIGH ELECTRON MOBILITY TRANSISTOR GROWTH ON SI SUBSTRATE AND THE METHOD THEREOF

TECHNICAL FIELD

The present disclosure relates to a structure of high electron mobility transistor growth on si substrate and the method thereof, and more particularly, to apply in the semiconductor manufacturing and it utilizes a ultra high vacuum chemical vapor deposition (UHVCVD) to grow a Ge film on the Si substrate, and utilizes a metamorphic high electron mobility transistor (MHEMT) to grow a transistor structure on the Ge film so as to decrease the thickness of the element and the manufacture cost.

TECHNICAL BACKGROUND

In recent years, the high-frequency microwave epitaxy chip is used in wide range, for example, mobile communication, global position system, wireless network etc. Therefore, the high-frequency element development has become the irresistible tide of the day. Specifically, the compound semiconductor epitaxial fabrication is one of the most development technologies.

There are three main types of the compound semiconductor epitaxial fabrication: Large Electron-Positron (LEP), Molecular Beam Epitaxy (MBE) and Metal-Organic Chemical Vapor Deposition (MOCVD).

The Large Electron-Positron (LEP), which is very traditional and easy manner, is applied in manufacturing the light emitting diode (LED). However, it is difficult to use LEP to manufacture the epitaxy layer with high doping concentration or the thin thickness.

The Molecular beam epitaxy (MBE), which is generated by the Physical optics method. The MBE is a successful generation technology and the production yield rate of MBE is higher. However, the cost of MBE is also higher.

The Metal-Organic Chemical Vapor Deposition (MOCVD) which has various chemical change and great technology difficult. However, the manufacture cost of MOCVD is lower and the production of the MOCVD is higher than the MBE. Moreover, the element manufactured by MOCVD has small size, high power, and the element is widely used in the mobile phone, for example, Pseudomorphic High Electron Mobility Transistor (PHMET), High Electron Mobility Transistor (HEMT), Metamorphic High Electron Mobility Transistor (MHEMT), etc.

Generally, the Metamorphic High Electron Mobility Transistor (MHEMT) is composed of InAlAs buffer layer. InAlAs spacer layer. InAlAs channel layer, InAlAs capping layer, and the MHEMT is grew on the substrate with InP or GaAs. However, the substrate with InP or GaAs is very expensive and has bad performance of mechanical, and it will cause that MHEMT is not easy to grow on the larger substrate and is also rapidly increasing in prices of cost.

In general technology, it combines the Si substrate and the III-V Compound semiconductor, and the $Si_xGe_{1-x}$ substrate is used to be the buffer layer, and the Ge film is grown on the Si substrate. Specifically, the $Si_xGe_{1-x}$ substrate compositing of the graded Ge is used in wide ranges. However, the thickness of the $Si_xGe_{1-x}$ substrate will achieve the tens mm. Therefore, the manufacture cost of the $Si_xGe_{1-x}$ substrate is higher and the MHEMT manufactured also has the deep thickness, and the mismatch and bug are also easy generated in growing of the GaAs.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

TECHNICAL SUMMARY

In view of the disadvantages mentioned above, the present invention provides a structure of high electron mobility transistor growth on Si substrate to solve these disadvantages.

In one embodiment, the present invention provides a structure of high electron mobility transistor growth on Si substrate, comprising:

a substrate, wherein material of the substrate is Si;

a film, wherein material of the film is Ge and the film grows on the substrate and the film's thickness is 1800 A~2200 A; and a transistor structure, wherein the transistor structure is a metamorphic high electron mobility transistor (MHEMT) structure and the transistor structure grows on the film.

In another embodiment, the present invention provides a method of growing high electron mobility transistor on Si substrate, comprising:

providing a substrate, wherein material of the substrate is Si;

utilizing a ultra high vacuum chemical vapor deposition (UHVCVD), and growing a Ge film in the substrate, and wherein thickness of the Ge film is 1800 A~2200 A; and utilizing a metal-organic chemical vapor deposition (MOCVD), and growing a transistor structure on the film, wherein the transistor structure is a metamorphic high electron mobility transistor (MHEMT) structure.

The present invention uses Ge film to protect the substrate (for example, Si substrate) so as to prevent to generate silicon oxide (SiO2) and decrease the quality of the film when it uses MOCVD to form the transistor substrate. If the Ge film directly grows on the substrate, the dislocation and defect will generate on the Ge film. Therefore, it is necessary to grow the metamorphic structure on the Ge film so as to use the metamorphic structure to prevent the dislocation of the Ge film growing upward and lower the thickness of element and manufacture cost.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DESCRIPTION OF THE EXEMPLARY EMBODIMENTS

Figure 1:
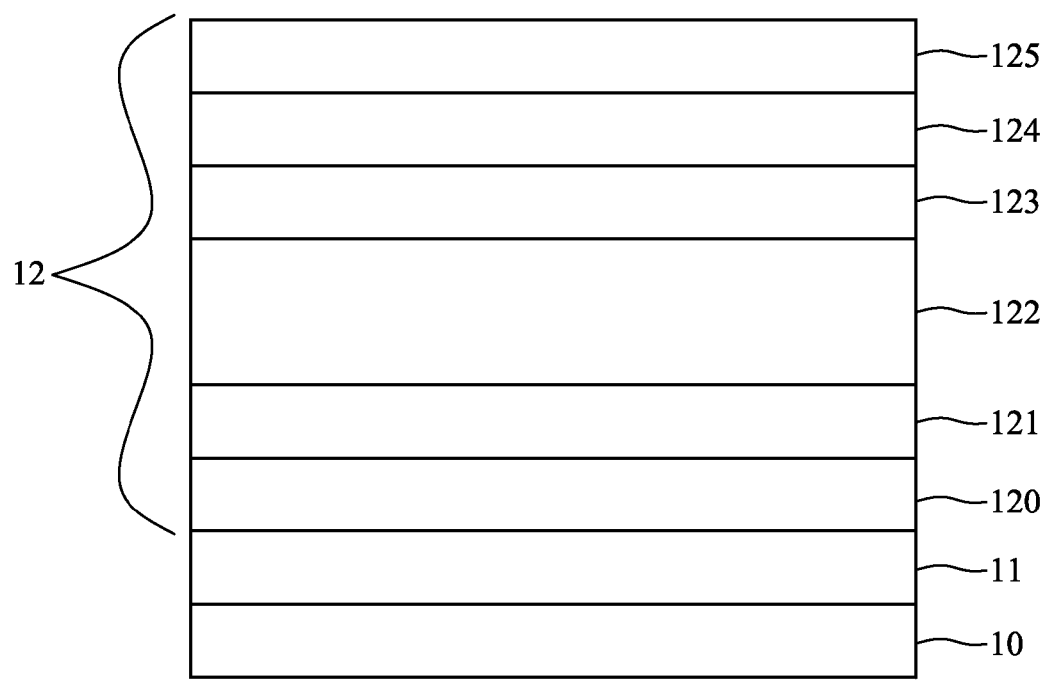
FIG. 1 is a schematic diagram showing a structure of high electron mobility transistor growth on Si substrate according to one embodiment of the present invention.

FIG. 1 is a schematic diagram showing a structure of high electron mobility transistor growth on Si substrate according to one embodiment of the present invention. The structure comprises:

a substrate 10, wherein material of the substrate is Si;

a film 11, wherein material of the film is Ge and the film grows on the substrate 10 and the film's thickness is 1800 Å~2200 Å by utilizing a ultra high vacuum chemical vapor deposition (UHVCVD), and wherein the optimal thickness is 2000 Å;

a transistor structure 12, wherein the transistor structure 12 is a metamorphic high electron mobility transistor (MHEMT) structure and the transistor structure 12 grows on the film by utilizing a metal-organic chemical vapor deposition (MOCVD).

Specifically, the transistor structure 12 further comprises:

a buffer layer 120, wherein material of the buffer layer 120 is III-V Compound (for example, InAlAs):

a channel layer 121, growing on the buffer layer 120, wherein material of the channel layer is III-V Compound (for example, InGaAs);

a space layer 122, growing on the buffer layer 121, wherein material of the space layer 122 is III-V Compound (for example, InAlAs);

a δ-doping layer 123, growing on the space layer 121, wherein the δ-doping layer 123 comprises a high concentration N-type material, which is used for providing electrons;

a schottky layer 124, growing on the δ-doping layer 123, wherein material of the schottky layer 124 is III-V Compound (for example, InAlAs); and a cover layer 125, growing on the schottky layer 124, wherein material of the cover layer 125 is III-V Compound with n+ doping (for example, n+-InAlAs).

Because the material of the substrate and the film 11 are respectively Si and Ge, the lattice constants of both are quite different (it is running at 4.2%) and the lattices of both can mismatch each other. Therefore, it forms dislocation and defect between the substrate 10 and the film 11. However, the transistor structure 12 is a metamorphic high electron mobility transistor (MHEMT) structure and it may use the buffer layer 120 in the transistor structure 12 to effectively decrease dislocation density and the defect density and successfully integrate the Si substrate and the MHEMT structure.

Figure 2:
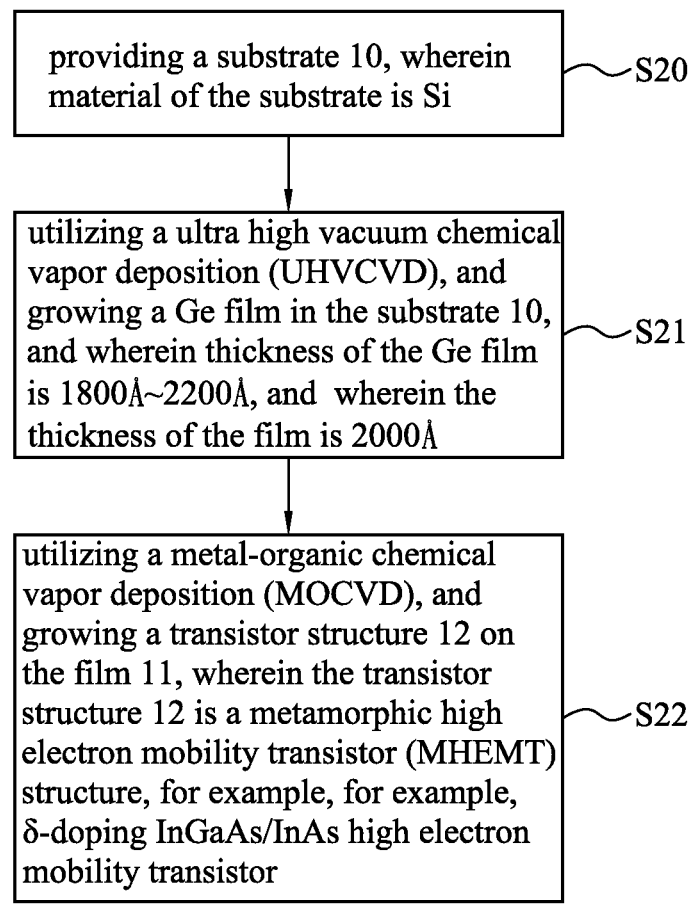
FIG. 2 is a flow chart showing a method of growing high electron mobility transistor on Si substrate according to one embodiment of the present invention.

FIG. 2 is a flow chart showing a method of growing high electron mobility transistor on Si substrate according to one embodiment of the present invention. The steps of the method comprises: Firstly, providing a substrate 10, wherein material of the substrate 10 is Si (Step s20). Subsequently, utilizing a ultra high vacuum chemical vapor deposition (UHVCVD), and growing a Ge film 11 in the substrate 10, and wherein thickness of the Ge film 11 is 1800 A~2200 A (Step s21). Specifically, the optimal thickness of the film 11 is 2000 Å. Afterward, utilizing a metal-organic chemical vapor deposition (MOCVD), and growing a transistor structure 12 on the film 11, wherein the transistor structure 12 is a metamorphic high electron mobility transistor (MHEMT) structure, for example, δ-doping InGaAs/InAs high electron mobility transistor (Step s22).

In conclusion, in accordance with the characteristic of the present invention, it uses Ge film to protect the substrate (for example, Si substrate) so as to prevent to generate silicon oxide (SiO2) and decrease the quality of the film when it uses MOCVD to form the transistor substrate. If the Ge film directly grows on the substrate, the dislocation and defect will generate on the Ge film. Therefore, it is necessary to grow the metamorphic structure on the Ge film so as to use the metamorphic structure to prevent the dislocation of the Ge film growing upward and lower the thickness of element and manufacture cost.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A method of growing high electron mobility transistor on Si substrate, comprising:

providing a substrate, wherein material of the substrate is Si;

utilizing a ultra high vacuum chemical vapor deposition (UHVCVD), and growing a Ge film on the substrate, and wherein thickness of the Ge film is 1800 Å~2200 Å; and utilizing a metal-organic chemical vapor deposition (MOCVD), and growing a transistor structure on the film, wherein the transistor structure is a metamorphic high electron mobility transistor (MHEMT) structure, wherein the transistor structure comprises a buffer layer, material of the buffer layer is III-V Compound, and the buffer layer is configured to decrease dislocation density and the defect density and integrate the Si substrate and the MHEMT structure.

2. The method of growing high electron mobility transistor on Si substrate as recited in claim 1, wherein the thickness of the film is 2000 Å.

* * * * *